(12) United States Patent
Matsuyama et al.

(10) Patent No.: US 6,555,421 B2
(45) Date of Patent: Apr. 29, 2003

(54) METHOD AND APPARATUS FOR MANUFACTURING SEMICONDUCTOR DEVICE

(75) Inventors: Naoko Matsuyama, Tokyo (JP); Sinya Sasaki, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 78 days.

(21) Appl. No.: 09/758,238

(22) Filed: Jan. 12, 2001

(65) Prior Publication Data

US 2001/0008782 A1 Jul. 19, 2001

(30) Foreign Application Priority Data

Jan. 19, 2000 (JP) .......................................... 2000-010791
Dec. 19, 2000 (JP) .......................................... 2000-385918

(51) Int. Cl.⁷ ............................................... H01L 21/00
(52) U.S. Cl. ...................... 438/164; 438/146; 438/680; 438/785
(58) Field of Search ................................ 438/164, 146, 438/680, 785

(56) References Cited

U.S. PATENT DOCUMENTS 5,221,561 A * 6/1993 Flicstein et al. ............ 427/534
5,393,624 A * 2/1995 Ushijima ..................... 430/30
5,468,521 A   11/1995 Kanai et al. ................. 427/575
5,990,007 A * 11/1999 Kajita et al. ................ 438/680
6,066,399 A *  5/2000 Hirano et al. .............. 428/408
6,329,303 B1* 12/2001 Mikata ....................... 438/785
6,362,494 B1*  3/2002 Yagi ............................ 257/76

FOREIGN PATENT DOCUMENTS

| JP | 04-112531 A | 4/1992 |
| JP | 7-094419 | 4/1995 |
| JP | 09-129626 | 5/1997 |
| JP | 09-134919 | 5/1997 |

* cited by examiner

Primary Examiner—Richard Elms
Assistant Examiner—Pho M. Luu
(74) Attorney, Agent, or Firm—McGinn & Gibb, PLLC

(57) ABSTRACT

A method and apparatus for manufacturing a semiconductor device can achieve the formation of thin films in a uniform thickness on a substrate. The method and apparatus includes a film-forming process in which film-forming gases 14, 15 are caused to flow over a surface of a substrate 11 substantially in parallel therewith to form thin films on the substrate surface. The film-forming process includes an initial film-forming step for forming a first thin film on the surface of the substrate 11 under a first film-forming conditions and a main film-forming step for forming, on the first thin film acting as a backing layer, a second thin film of a thickness greater than that of the first thin film under a second film-forming condition which differs from the first film-forming condition.

12 Claims, 9 Drawing Sheets

METHOD AND APPARATUS FOR MANUFACTURING SEMICONDUCTOR DEVICE

BACKGROUND OF THE INVENTION

1. Field of the Invention

The present invention relates to a method and apparatus for manufacturing a semiconductor device, and more particularly, it relates to such a method and apparatus for manufacturing thin films of a uniform thickness on a substrate.

2. Description of the Related Art

When thin films are formed on a substrate, a film-forming apparatus of the sheet-feed type is used as one example.

An explanation will be made of the case in which a tantalum oxide thin film (Ta$_2$O$_5$ film) is formed on a substrate as a concrete example. Generally, the tantalum oxide thin film is formed by means of a CVD method.

FIG. 11 is a schematic view showing one example of such conventional semiconductor manufacturing apparatuses for forming thin films of tantalum oxide on a substrate. As a raw material for the tantalum oxide thin film, pentaethoxy tantalum in a liquid state is used, and it is accommodated in a tank 21 which is disposed in a thermostatic chamber 22. The temperature of the tank 21 is controlled at a constant temperature such as, for example, 35° C. by means of the thermostatic chamber 22. An N2 gas supplied to the tank 21 from an N2 supply piping 28 pressurizes the interior of the tank 21, so that the pentaethoxy tantalum, which is contained therein as a liquid raw material, is pushed out to a raw material supply piping 29. The pentaethoxy tantalum in the form of a liquid taw material as described above is supplied from the raw material supply piping 29 to an evaporator 23, and an N2 carrier gas is also supplied to the evaporator 23 from the N2 supply piping 28. A film-forming gas evaporated by the evaporator 23 is introduced through the supply piping 24 into a reaction chamber 25 together with the above-mentioned N2 carrier gas. Simultaneous with this, oxygen is introduced into the reaction chamber 25 from an oxygen tank (not shown), so that the pentaethoxy tantalum is thermally decomposed in the reaction chamber 25 to form a tantalum oxide thin film on a substrate. After the formation of the tantalum oxide thin film, the atmosphere in the reaction chanter 25 is exhausted by a discharge pump 26 through an exhaust piping 27.

In the prior art, to form a tantalum oxide thin film on a substrate uniformly, there have been proposed various configurations of the reaction chamber 25, introduction and exhaust recipes for the film-forming gas, etc.

For example, Japanese Patent Application Laid-Open No. 7-94419 discloses a semiconductor processing apparatus which is constructed as follows. A flat reaction tube is provided in a heating space defined by a pair of parallel plate heaters with a substrate to be treated being disposed in the heating space. The reaction tube is provided at it opposite ends with a gas feed port and a gas exhaust port. The direction of flow of the film-forming gas can be switched over during an film-forming operation.

FIG. 12 illustrates the reaction chamber of the semiconductor processing apparatus as described in the above-mentioned Japanese Patent Laid-Open No. 7-94419. In this figure, an unillustrated substrate is horizontally disposed substantially in the center of the interior of the reaction tube 31, and gas feed ports 32, 33 and gas exhaust ports 34, 35 are provided at opposite ends of the reaction tube 31, the gas feed ports 32, 33 being disposed in an opposed relation with respect to the gas exhaust ports 34, 35, respectively, with the substrate being interposed therebetween. For example, a gas supplied from the gas feed port 32 passes through the reaction tube 31 substantially in parallel with the substrate to be exhausted from the gas exhaust port 35, as indicated by an arrow 36 in FIG. 12, thus forming a first thin film on the substrate. Subsequently, the direction of flow of the film-forming gas is reversed, that is, the film-forming gas is supplied from the gas feed port 33 to the reaction tube 31, passing the surface of the substrate as indicated at an arrow 37, and exhausted from the gas exhaust port 34, thereby forming a second thin film on the substrate. Such a method of supplying a film-forming gas while alternately changing the direction of flow thereof is generally called a flip-flop method. The reason for adopting the flip-flop method is to counterbalance or offset an inclination that the thin film tends to have in the direction of flow of the film-forming gas, by reversing the flow of the film-forming gas.

Concretely, in cases where the film-forming gas is caused to flow in one direction from an upstream side to a downstream side along a surface of the substrate 11 so as to form a thin film thereon, as indicated at arrows 41 in FIG. 13, the thickness of the thin film thus formed tends to be thicker in a direction from the upstream to the downstream side, as illustrated in FIG. 14. The reason for this phenomenon is considered as follows. That is, generally, the internal pressure of the reaction chamber or reaction tube 31 is as low as 25 Pa or so and the flow rate or speed of the film-firming gas is high, so that the film-forming gas, being not heated until it enters the reaction chamber, has a tendency that it is activated hardly at the upstream side but easily at the downstream side. Accordingly, in the prior art, the flip-flop method is used to provide a thin film on the substrate 11 substantially in parallel to a surface thereof, as illustrated in FIG. 16, by causing the film-forming gas to flow from the upstream side to the downstream side in parallel with the surface of the substrate 11 as indicated at arrows 41 in FIG. 15, and then causing the film-forming gas to flow in a reverse direction from the downstream to the upstream side as indicated at arrows 42 to thereby offset the inclination in the thickness of the thin film. As illustrated in FIG. 16, on a first layer 51 in the form of a thin film on a substrate 11 obtained by causing a film-forming gas to flow from an upstream to a downstream side as indicated at an arrow 41, there is formed a second layer 51 in the form of a thin film by causing a film-forming gas to flow from the downstream to the upstream side as depicted at an arrow 42, and hence it is intended to provide the formation of thin films which are substantially in parallel to a surface of the substrate 11 as a whole.

However, there is a problem in that in actuality, the use of the conventional film-forming method as referred to above could not provide a good result of thin film formation as illustrated in FIG. 16.

FIG. 17 illustrates a cross section of thin films obtained by the above-mentioned Prior art technology. As is clear from this figure, the formation of thin films in parallel to a surface of a substrate 11 is not achieved although on a first layer 51' in the form of a thin film that is formed by causing a film-forming gas to flow in a direction from an upstream to a downstream side as indicated at an arrow 41, there is provided a second layer 52' in the form of a thin film that is obtained by causing the film-forming gas in a reverse direction from the downstream to the upstream side as indicated at an arrow 42.

The reason for this is that upon forming the thin films, the first layer 51' is influenced by the surface condition of the substrate 11 which is a base or backing layer for the formation of the first layer 51", so that an inclination in the thickness of the first layer 51' becomes remarkable, whereas the second layer 52' has a backing layer in the form of the first layer 51' which is of the same material as that of the second layer 52", thus providing a tendency not to create a thickness inclination. Therefore, the distribution of thickness of the thin films or layers is greatly influenced by the arrangement or condition of the first layer 51", so if the inclination of the first layer 51' is great, even the use of the flip-flop method could not achieve a uniform planarization of the thickness of the first and second layers.

SUMMARY OF THE INVENTION

In view of the above, an object of the present invention is to provide a semiconductor manufacturing method and a semiconductor manufacturing apparatus which are capable of achieving the formation of thin films, of a uniform thickness on a substrate.

In order to achieve the above object, according to a first aspect of the present invention, there is provided a method for manufacturing a semiconductor device including a film-forming process for causing a film-forming gas to flow over a surface of a substrate substantially in parallel therewith to form thin films on the substrate surface. The film-forming process comprises: an initial film-forming step for forming a first thin film on the surface of the substrate under a first film-forming condition; and a main film-forming step for forming, on the first thin film acting as a backing layer, a second thin film of a thickness greater than that of the first thin film under a second film-forming condition that differs from the first film-forming condition, Pursuant to this method, the formation of the first thin film on the substrate surface in the initial film-forming step serves to suppress adverse effects which would otherwise result from the surface condition of the substrate, as a consequence of which the thin films of a uniform thickness can be formed on the substrate over the entire surface thereof according to the main film-forming step.

In this regard, note that the expression "the film-forming gas is caused to flow substantially in parallel with the surface of the substrate" referred to herein means that the film-forming gas is caused to flow in a predetermined direction with respect to the substrate, e.g., in a longitudinal direction thereof if the substrate takes the shape of a rectangular configuration.

In a preferred form of the first aspect of the invention, in the initial film-forming step, the film-forming gas is supplied a predetermined number of times by changing the direction of flow of the film-forming gas.

Thus, the first thin film formed in the initial film-forming step has a uniform thickness over the entire surface of the substrate, so that the second thin film of a uniform thickness can be formed on the first thin film and hence on the surface of the substrate.

Here, note that the term "a predetermined number of times" referred to herein means a number of times with which there is obtained the first thin film of a substantially uniform thickness on the substrate surface capable of exhibiting an intended effect of the invention.

In another preferred form of the first aspect of the invention, the flow rate of the film-forming gas in the initial film-forming step is less than that in the main film-forming step.

Thus, the distribution of the thickness of the first thin film upon initial film forming can be made further uniform, resulting in the formation of thin films of a further uniform thickness on the substrate.

According to a second aspect of the present invention, there is provided a method for manufacturing a semiconductor device including a film-forming process for causing a film-forming gas to flow over a surface of a substrate substantially in parallel therewith to form thin films on the substrate surface, the film-forming process comprising: an initial film-forming step for forming a first thin film on the surface of the substrate; and a main film-forming step for forming, on the first thin film acting as a backing layer, a second thin film at a film-forming rate greater than that in the initial film-forming step.

Accordingly, a thin film in the form of the first thin film can be formed on the surface of the substrate in the initial film-forming step, so adverse effects which would otherwise result from the surface condition of the substrate can be suppressed, as a consequence of which a thin film in the form of the second thin film of a uniform thickness can be formed on the substrate in the main film-forming step.

According to a third aspect of the present invention, there is provided a method for manufacturing a semiconductor device including a film-forming process for forming a thin film of tantalum oxide on a surface of a substrate by using a film-forming gas including a gas evaporated from pentaethoxy tantalum, the film-forming process comprising: an initial film-forming step for forming a first thin film of tantalum oxide on the surface of the substrate under a first film-forming condition; and a main film-forming step for forming, on the first thin film acting as a backing layer, a second thin film of tantalum oxide having a thickness greater than that of the first thin film under a second film-forming condition that differs from the first film-forming condition.

Thus, using the semiconductor manufacturing method of the present invention, uniform thin films in the form of the uniform tantalum oxide films can be formed on the substrate although forming tantalum oxide films on a substrate is generally liable to be influenced by the surface condition of the substrate.

In a preferred form of the third aspect of the invention, in the film-forming process in which the film-forming gas containing a gas evaporated from pentaethoxy tantalum is used to form a tantalum oxide film on the surface of the substrate, the film-forming gas is caused to flow over the substrate surface substantially in parallel therewith.

Thus, since the first thin film formed in the initial film-forming step has a uniform thickness over the entire surface of the substrate, it is possible to provide the second thin film of a uniform thickness on the first thin film and hence on the surface of the substrate.

In another preferred form of the third aspect of the invention, the flow rate of the film-forming gas in the initial film-forming step is less than that in the main film-forming step.

Thus, since the distribution of the thickness of the first thin film upon initial film forming can be made further uniform, it is possible to form thin films of a further uniform thickness on the substrate.

According to a fourth aspect of the present invention, there is provided a method for manufacturing a semiconductor device including a film-forming process for forming a thin film of tantalum oxide on a surface of a substrate by using a film-forming gas including a gas evaporated from pentaethoxy tantalum, the film-forming process comprising:

an initial film-forming step for forming a first thin film of tantalum oxide on the surface of the substrate under a first film-forming condition; and a main film-forming step for forming, on the first thin film acting as a backing layer, a second thin film of tantalum oxide having a thickness greater than that of the first thin film under a second film-forming condition that differs from the first film-forming condition; wherein the initial film-forming step and the main film-forming step are performed continuously in a common reaction chamber by means of a thermal CVD method.

Thus, using the semiconductor manufacturing method of the fourth aspect of the present invention, uniform tantalum oxide films can be formed on the substrate at low cost although forming tantalum oxide films on a substrate is generally liable to be influenced by the surface condition of the substrate.

According to a fifth aspect of the present invention, there is provided a semiconductor manufacturing apparatus comprising; a reaction chamber adapted to accommodate a substrate and having at least one gas feed port and at least one exhaust port; valves for opening and closing the at least one gas feed port and the at least one exhaust port; and a gas supply system for supplying a first film-forming gas and a second film-forming gas to the reaction chamber from the at least one gas feed port; wherein the gas supply system operates such that the first film-forming gas is caused to flow from the at least one gas feed port over a surface of the substrate substantially in parallel therewith to form a first thin film on the substrate surface under a first film-forming condition, and subsequently, the second film-forming gas is caused to flow from the at least one gas feed port over the substrate surface substantially in parallel therewith to form, on the first thin film acting as a backing layer, a second thin film of a thickness greater than that of the first; thin film under a second film-forming condition which differs from the first film-forming condition. In a preferred form of the fifth aspect of the invention, the second film-forming gas is the same as the first film-forming gas.

In another preferred form of the fifth aspect of the invention, the second film-forming gas is different from the first film-forming gas.

According to a sixth aspect of the present invention, there is provided a semiconductor manufacturing apparatus comprising: a reaction chamber adapted to accommodate a substrate and having at least one gas feed port and at least one exhaust port; valves for opening and closing the at least one gas feed port and the at least one exhaust port; and a gas supply system for supplying a film-forming gas containing a gas evaporated from pentaethoxy tantalum to the reaction chamber from the at least one gas feed port; wherein the gas supply system operates such that the film-forming gas is supplied from the at least one gas feed port to a surface of the substrate to form a first thin film of tantalum oxide on the substrate surface under a first film-forming condition, and subsequently, the film-forming gas is supplied from the at least one gas feed port to the substrate surface to thereby form, on the first thin film acting as a backing layer, a second thin film of tantalum oxide having a thickness greater than that of the first thin film under a second film-forming condition which differs from the first film-forming condition.

Thus, using the semiconductor manufacturing apparatus of the present invention, it is possible to provide uniform thin films in the form of the uniform tantalum oxide films on the substrate although forming tantalum oxide films on a substrate is generally liable to be influenced by the surface condition of the substrate.

The above and other objects, features and advantages of the present invention will become more readily apparent to those skilled in the art from the following detailed description of preferred embodiments of the invention taken in conjunction with the accompanying drawings.

DESCRIPTION OF THE ACCOMPANYING DRAWINGS

DESCRIPTION OF THE PREFERRED EMBODIMENTS

Figure 1A:
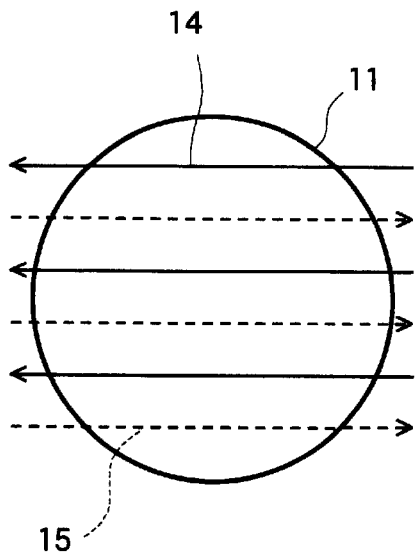
FIGS. 1A and 1B are views illustrating one example of a semiconductor manufacturing method according to the present invention.

Now, preferred embodiments of the present invention will be described in detail while referring to the accompanying drawings.

A method of manufacturing a semiconductor device according to the present invention is featured in a film-forming process in which thin films are formed on a surface of a substrate.

Any well-known conventional measures or technologies can be used for steps for introducing a substrate into a reaction chamber and taking it out therefrom.

In the following, reference will be made to the case in which a tantalum oxide thin film is formed on a substrate for the purpose of explaining the present invention. It is needless to say that a method for manufacturing a semiconductor device and a semiconductor manufacturing apparatus according to the present invention are not limited to the embodiments, herein described by way of examples only, for forming a tantalum oxide thin film.

The present invention is characterized in that it includes a film-forming process comprising an initial film-forming step for forming a first thin film on a surface of a substrate under a first film-forming condition, and a main film-forming step for forming, on the first thin film, a second thin film of a thickness greater than the first thin film under a second film-forming condition that differs from the first film-forming condition. Thus, the formation of a thin film in the form of the first thin film on the substrate in the initial film-forming step serves to suppress adverse effects, which would otherwise result from a surface condition of the substrate, thereby making it possible to provide thin films of a uniform thickness over the entire surface of the substrate in the following main film-forming step.

Although the condition in the initial film-forming step is not limited in particular as far as a thin film is formed on a substrate, it is preferred that a flip-flop method in a thermal CVD process be employed in which a film-forming gas is supplied a predetermined number of times while changing the direction of gas flow or stream. The number of times for changing the flow direction of the film-forming gas can be properly set in consideration of the surface condition of the substrate and the like. In addition, for example, conditions for initial film-forming are as follows; film-forming temperature is 450–470° C.; pressure is 20–50 Pa; flow rate of pentaethoxy tantalum is 0.005–0.1 sccm; flow rate of oxygen is 0–500 sccm; film thickness is 0.5–1.5 nm; and film-forming time or duration is 10–30 seconds (i.e., a period of time of 2×t1 in FIG. 1($b$) to be described later).

Conditions for the main film-forming step can be properly determined according to the type, etc., of a semiconductor device to be manufactured, and hence are not limited in particular, it is preferable to adopt a flip-flop method as in the initial film-forming step. For example, conditions for main film-forming in this case are as follows: film-forming temperature is 450–470° C. pressure is 20–50 Pa; flow rate of pentaethoxy tantalum is 0.1–0.2 sccm; flow rate of oxygen is 0–500 sccm; film thickness is 5–10 nm; and film-forming time or duration is 40–240 seconds (i.e., a period of time of 2×t2 in FIG. 1($b$)).

The above conditions are set such that the film-forming rate or speed a for the initial film-forming is less than the film-forming rate or speed b for the main film-forming (i.e., a<b) within the ranges of the conditions shown in this example, so as to improve controllability of the film thickness distribution of the initial film-forming.

As described above, it is desirable that the flow rate of the film-forming gas in the initial film-forming step be less than that in the main film-forming step, so as to suppress or reduce the film-forming rate or speed in the initial film-forming step. Moreover, it is desirable that the film-forming rate or speed be greater in the main film-forming step than in the initial film-forming step.

Figure 1B:
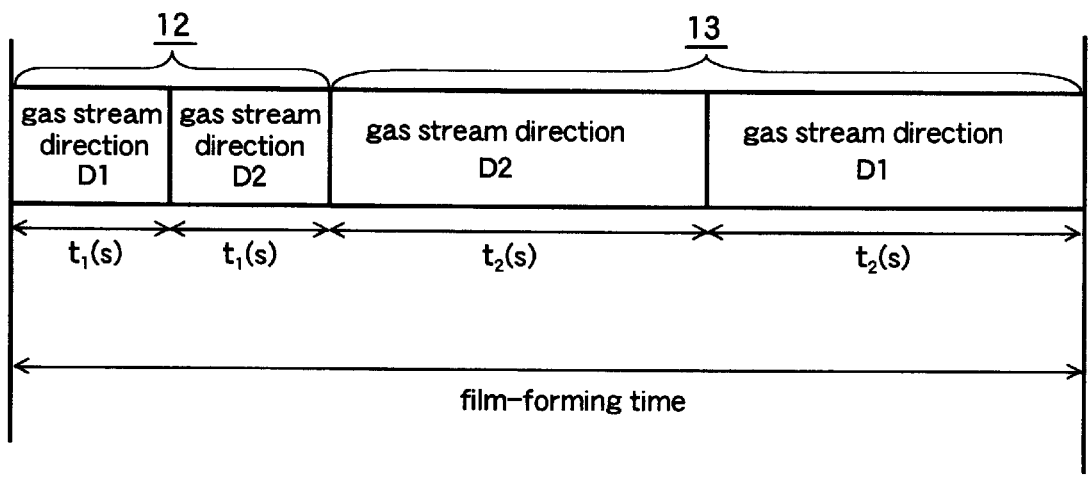

FIGS. 1A and 1B illustrate one example of a semiconductor manufacturing method of the present invention.

In this example, a film-forming process is composed of an initial film-forming step 12 and a main film-forming step 13. For the initial film-forming step 12, a flip-flop method is adopted like the direction of flow of a film-forming gas as shown in FIG. 1($a$). That is, in FIG. 1($a$), the film-forming gas is caused to flow over a surface of a substrate 11 in one direction indicated at arrows 14 (i.e., hereinafter called "the direction of the gas stream D1"), and then, the direction of flow of the film-forming gas is reversed as indicated at arrows 15 (i.e., hereinafter called "the direction of the gas stream D2").

Moreover, as shown in FIG. 1($b$), in the initial film-forming step 12, the film-forming gas is first supplied in the direction of the gas stream D1 for a period of t1 seconds, and then in the direction of the gas stream D2 for the same period of t1 seconds. Thereafter, in the main film-forming step 13, the film-forming gas is supplied in the direction of the gas stream D2 for a period of t2 seconds and then in the direction of the gas stream D1 for the same period of t2 seconds. In this connection, it is to be noted that though in the main film-forming step 13, the supply of the film-forming gas is first carried out in the gas stream direction D2 and then in the gas stream direction D1 as shown in FIG. 1($b$), this order may be reversed. However, the former order is preferable because switching of the valves for the film-forming gas feed or exhaust ports can be performed more smoothly in the former order than in the latter order.

The sum of the film-forming gas supply period of t1 seconds in the gas stream direction D1 and that of $t_1$ seconds in the gas stream direction D2 (i.e., 2×$t_1$) in the initial film-forming step 12 is an initial film-forming time for which there is formed a very thin film of a uniform thickness over the entire surface of the substrate. Also, the sum of the film-forming gas supply period of $t_2$ seconds in the gas stream direction D2 and that of $t_2$ seconds in the gas stream direction D1 (i.e., 2×$t_2$) in the main film-forming step 13 is a main film-forming time for which there is formed a second thin film of a uniform thickness greater than that of the first thin film over the substrate, with the first very thin film formed in the initial film-forming step 12 being used as a base or backing layer. Thus, the sum of the initial film-forming time (2×$t_1$) and the main film-forming time (2×$t_2$) becomes a total film-forming time for the entire film-forming process. Here, it is to be noted that in this example, the initial film-forming step and the main film-forming step are continuously carried out in a common or one and the same reaction chamber by means of the thermal CVD method, and hence are advantageous from an economical point of view.

Figure 12:
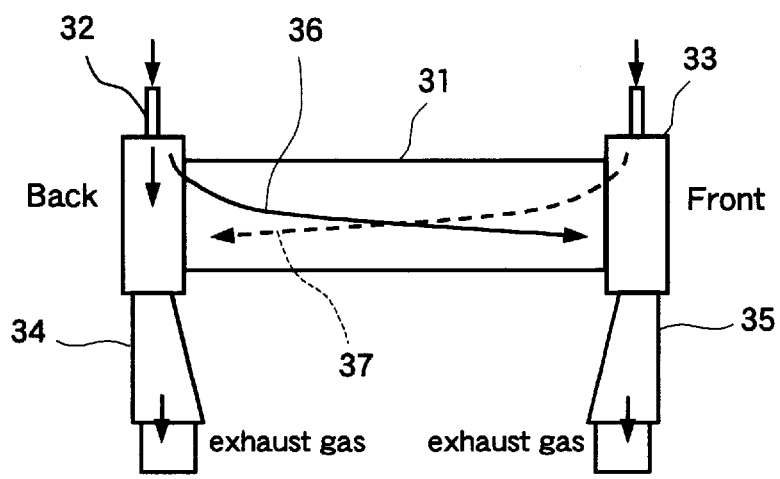
FIG. 12 is a view showing a reaction chamber of reaction tube of a semiconductor processing apparatus described in Japanese Patent Application Laid-Open No. 7-94419.
Figure 13:
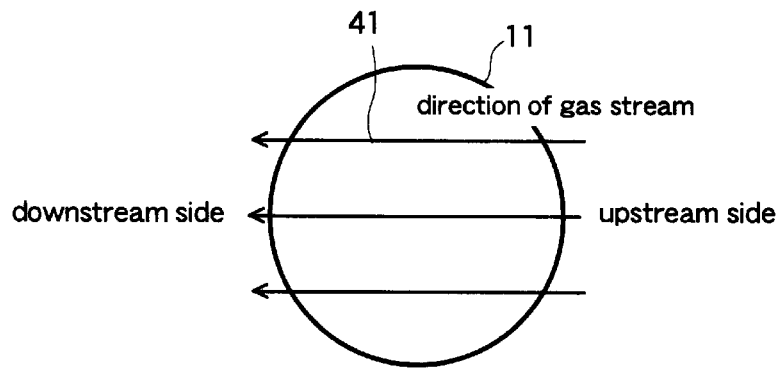
FIG. 13 is a view illustrating the case where a film-forming gas is caused to flow over a surface of a substrate in one direction.
Figure 14:
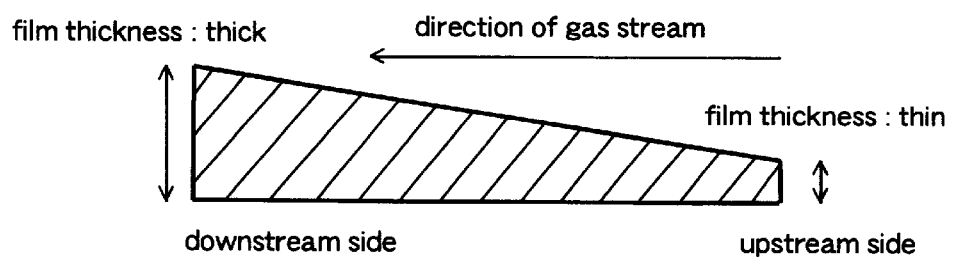
FIG. 14 is a view illustrating the condition of thin films formed on a substrate in the case where a film-forming gas is caused to flow over a surface of the substrate in one direction.
Figure 15:
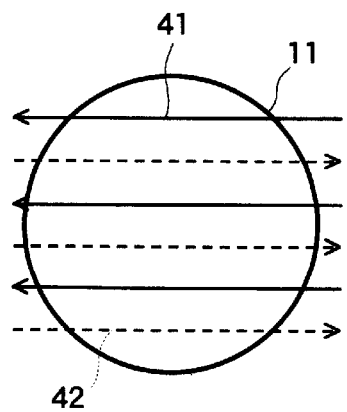
FIG. 15 is a view illustrating the direction of supply of a film-forming gas in a flip-flop method.
Figure 16:
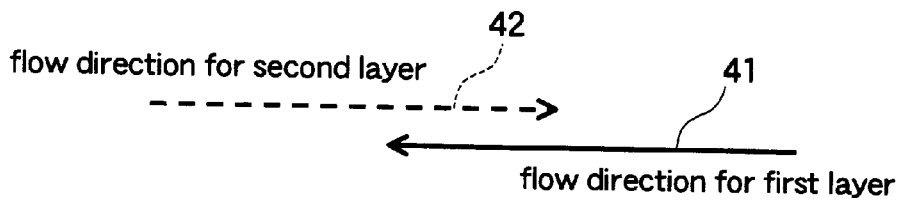
FIG. 16 is a view illustrating the ideal condition of thin films obtained by means of a flip-flop method.
Figure 16:
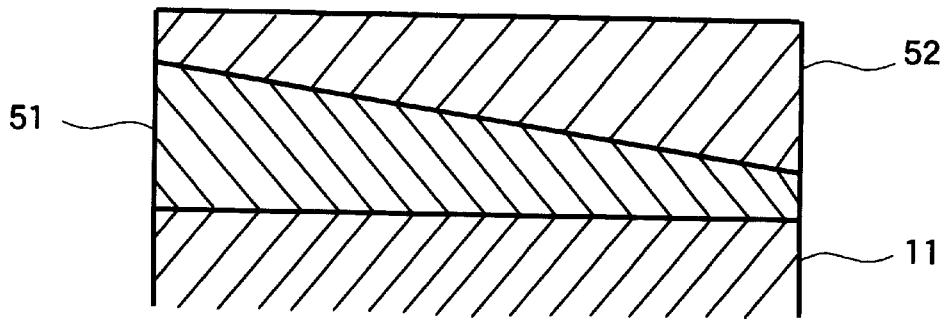
Figure 17:
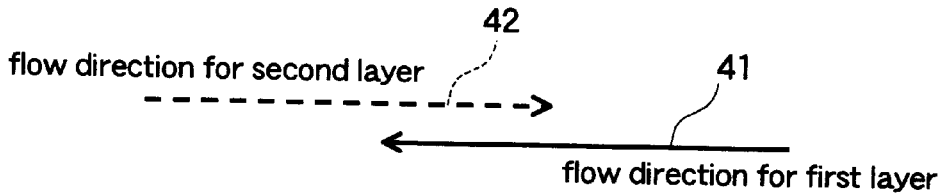
FIG. 17 is a view illustrating the condition of thin films obtained by means of a conventional flip-flop method.
Figure 17:
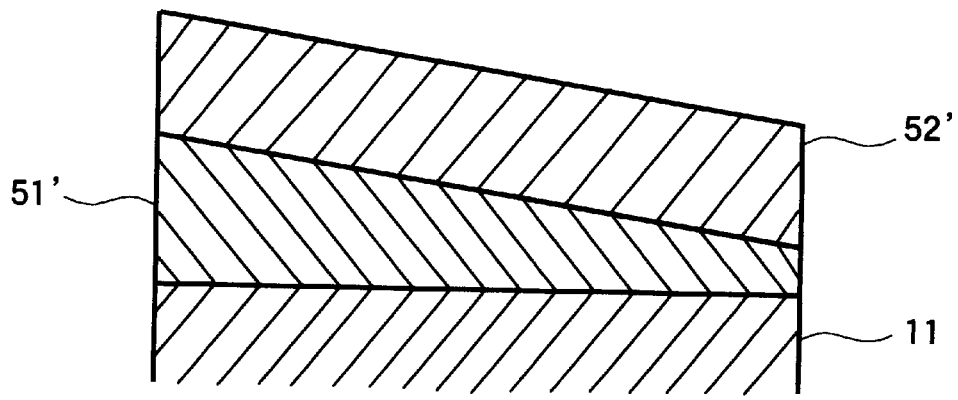

A semiconductor manufacturing apparatus for implementing a semiconductor manufacturing method of the present invention includes a reaction chamber adapted to accommodate a substrate and having at least one gas feed port and at least one gas exhaust port, valves for opening and closing the at least one gas feed port and the at least one gas exhaust port, and a gas supply system for supplying a film-forming gas to the reaction chamber from the at least one gas feed port. Here, note that in the case of a semiconductor manufacturing apparatus adopting a flip-flop method, it is required that a reaction chamber have at least two gas feed ports and at least two gas exhaust ports. For such an apparatus adopting the flip-flop method, a reaction chamber in the form of a reaction tube 31 as disclosed, for example, in the above-mentioned Japanese Patent Application Laid-Open No. Hei 7-94419, e.g., shown in FIG. 12 can be employed in which an unillustrated substrate is disposed horizontally substantially in the center thereof and which has a pair of gas feed ports 32, 33 and a pair of gas exhaust ports 34, 35 respectively provided at opposite ends of the reaction tube 31 in a face-to-face positional relation with respect to each other with the substrate interposed therebetween.

Figure 2:
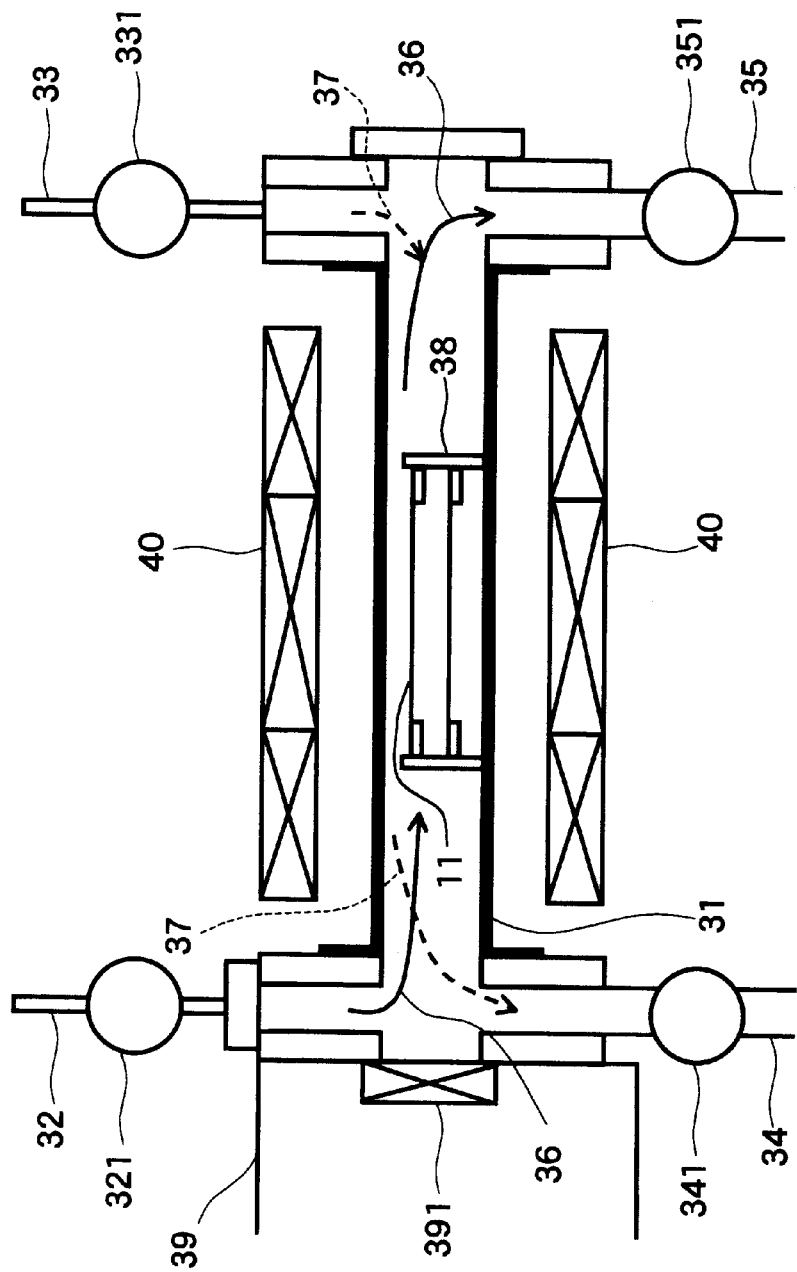
FIG. 2 is a view illustrating one example of a semiconductor manufacturing apparatus adapted to be used for implementing a semiconductor manufacturing method of the present invention.

More specifically, FIG. 2 illustrates one example of a semiconductor manufacturing apparatus for implementing a method of manufacturing a semiconductor device according to the present invention. A substrata support 38 is installed in a rectangular-shaped reaction tube 31 made of quartz or the like, with a substrate 11 being mounted thereon in a horizontal manner. A pair of gas feed ports 32, 33 and a pair of gas exhaust ports 34, 35 are provided at the opposite ends, respectively, of the reaction tube 31 in a face-to-face positional relation with respect to each other with the substrates 11 being disposed therebetween. The gas feed ports 32, 33 and the gas exhaust ports 34, 35 are coupled with the reaction tube 31 through valves 321, 331, 341, 351. These valves can be respectively operated to open or close the corresponding gas feed ports and the corresponding gas exhaust ports. In the film-forming process, a film-forming gas supplied, for example, from the gas feed port 32 as described above passes the inside of the reaction tube 31 substantially in parallel to the substrate 11 as shown at solid line arrows 36 in FIG. 2, and it is exhausted from the gas exhaust port 35, i.e., in the direction of the gas stream D1. Subsequently, the film-forming gas is supplied to the reaction chamber 31 from the gas feed port 33, passing therethrough over a surface of substrate 11 in the reverse direction D2, i.e., in a direction opposite the gas stream direction D1, as indicated at broken line arrow 37, and exhausted from the gas exhaust port 34. A reference numeral 39 designates a transportation chamber connected with the reaction tube 31 through a gate valve 391 for transporting the substrate 11 into or out of the reaction tube 31.

In addition, a suitable heating element 40 may be provided for uniformly heating the substrate 11 to a desired temperature, as depicted in FIG. 2. For such a heating element 40, a resistance heater is preferred, and a heating process of the hot wall type is preferred for heating and maintaining the temperature in the reaction tube 31 to the desired temperature prior to the substrate 11 being transported into the reaction tube 31. Of course, the heating element 40 may be a lamp, a high frequency generator and the like.

In this regard, note that the pressure, temperature, duration and flow rate for introduction of the film-forming gas, the discharge pressure, the discharge duration, selection of the carrier gas, the temperature of a substrate heating step, the opening degree of the valves, etc., may be properly selected in consideration of the kind of thin films to be created, the size of a film-forming apparatus to be employed, and like other factors.

EMBODIMENTS

Now, further reference will be made to specific embodiments of the present invention.

Thin films of tantalum oxide were formed on a substrate using a semiconductor manufacturing method of the present invention and a conventional semiconductor manufacturing method, respectively, and uniformity in the thickness of the thin films thus formed was examined.

Figure 3:
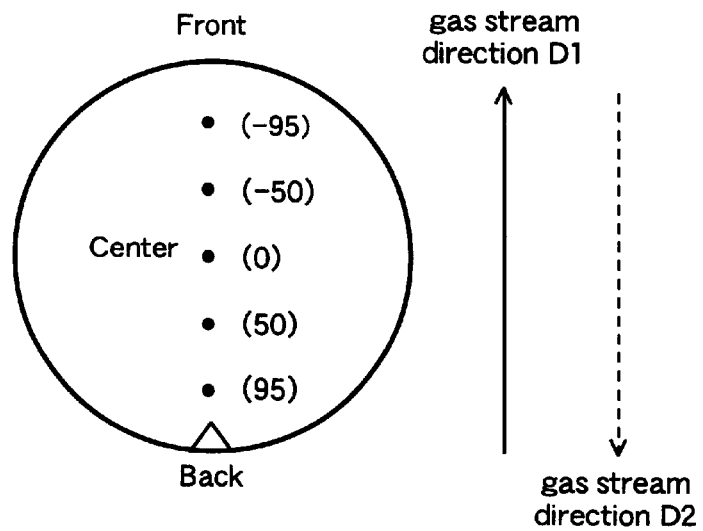
FIG. 3 is a view showing points of measurements in an embodiment of the present invention.

As shown in FIG. 3, the center of the substrate is taken as a zero point of measurement (0 mm) at which the film thickness in terms of angstroms was measured. Moreover, measurements were made at points 50 mm and 95 mm apart from the zero point of measurement (0 mm) to the front side (i.e., indicated at −50 mm and −95 mm, respectively, in FIG. 3), and at points 50 mm and 95 mm apart from the zero point of measurement (0 mm) to the back side (i.e., indicated at 50 mm and 95 mm, respectively, in FIG. 3). Regarding the directions of the gas stream, there were adopted two directions comprising the gas stream direction D1 and the gas stream direction D2. That is, a flip-flop method was employed. All the film-forming process conditions for the method of the present invention and the conventional method were made the same excepting that an initial film-forming step was adopted for the present invention.

Figure 4:
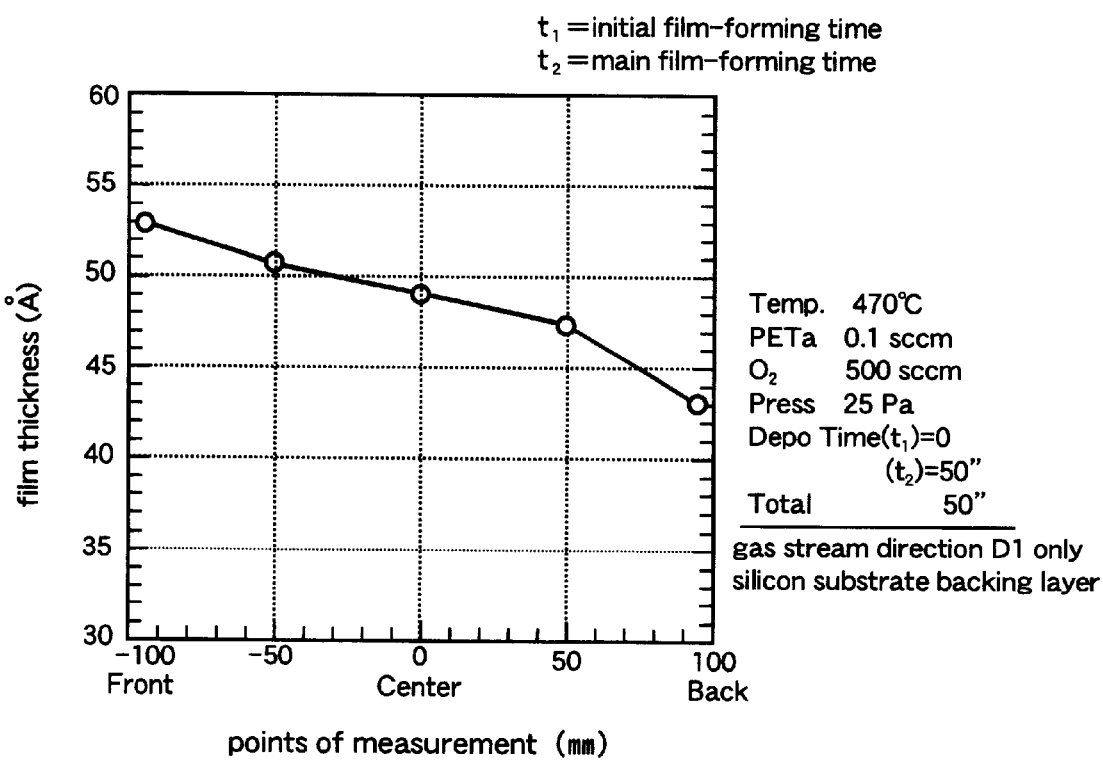
FIG. 4 is a view showing the distribution of the thickness of thin films formed on a substrate in the case where the substrate comprises a silicon substrate with a film-forming gas being supplied to a reaction chamber only in a direction of gas stream D1.

FIG. 4 illustrates, for the sake of reference, the distribution of the thickness of thin films formed on a substrate in the form of a silicon substrate in the case where a film-forming gas is supplied only in the direction of the gas stream D1. From this figure, it can be seen that the film thickness increases from the upstream side (back side) to the downstream side (front side) of the direction of the gas stream D1. The reason for this is considered that a flip-flop method was not employed with the direction of the gas stream being fixed and not changed, and the surface condition (i.e., non-uniform distribution of the thickness of the surface layer) of the silicon substrate adversely influenced on the formation of the thin films. The film-forming conditions are shown in FIG. 4 in which Temp represents a film-forming temperature at which formation of the thin films were carried out; PETA represents the flow rate of pentaethoxy tantalum; O2 represents the flow rate of oxygen; Press represents the pressure in the reaction chamber, Depo Time represents a deposition time for which pentaethoxy tantalum was deposited on the substrate; and Total represents a total sum of an initial film-forming time and a main film-forming time. These are applicable in FIG. 5 and the following figures.

Figure 5:
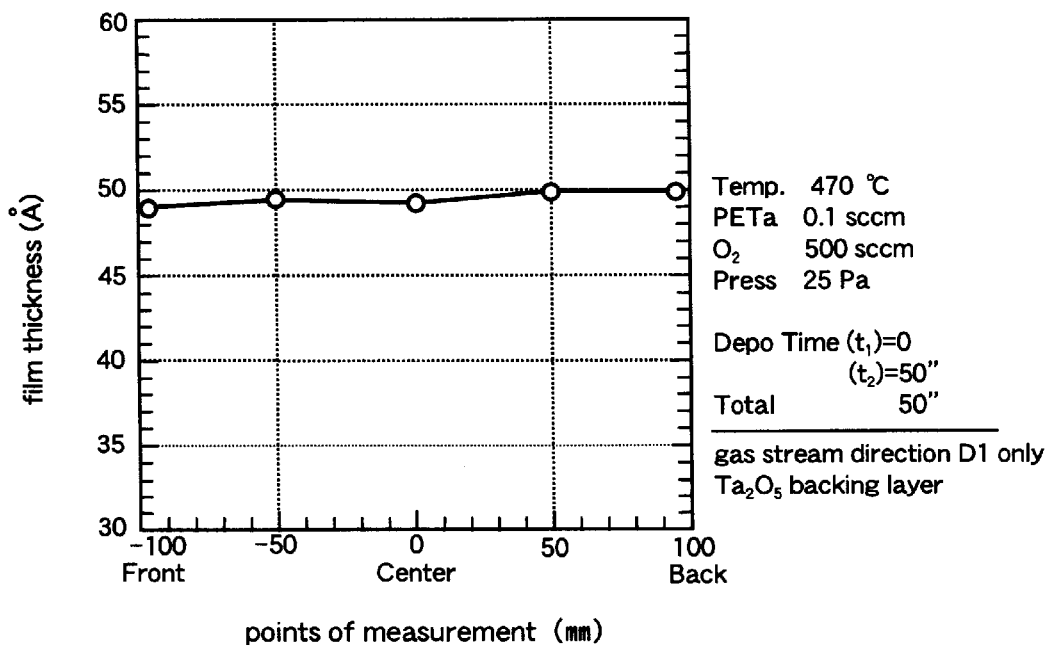
FIG. 5 is a view showing the distribution of the thickness of thin films formed on a substrate in the case where the substrate comprises a silicon substrate with a thin film of pentaethoxy tantalum having been provided thereon as a backing layer in advance, and a film-forming gas is supplied to a reaction chamber only in a direction of gas stream D1.

FIG. 5 illustrates, for the sake of reference, the distribution of the thickness of the thin films of pentaethoxy tantalum formed on the substrate in the case where the substrate comprises a silicon substrate, and a thin film of pentaethoxy tantalum has been formed on the silicon substrate beforehand as a backing layer with a film-forming gas being supplied only in the direction of gas steam D1. From this figure, it can be seen that the film thickness is substantially uniform over the entire substrate surface from the upstream side (back side) to the downstream side (front side) in the direction of the gas stream D1. The reason for this is considered as follows. That is, although a flip-flop method was not adopted, the backing layer and the thin film to be formed thereon were of the same material, and hence the surface condition of the silicon substrate had no or little influence on the film forming, thus achieving the formation of the good thin film thereon.

Figure 6:
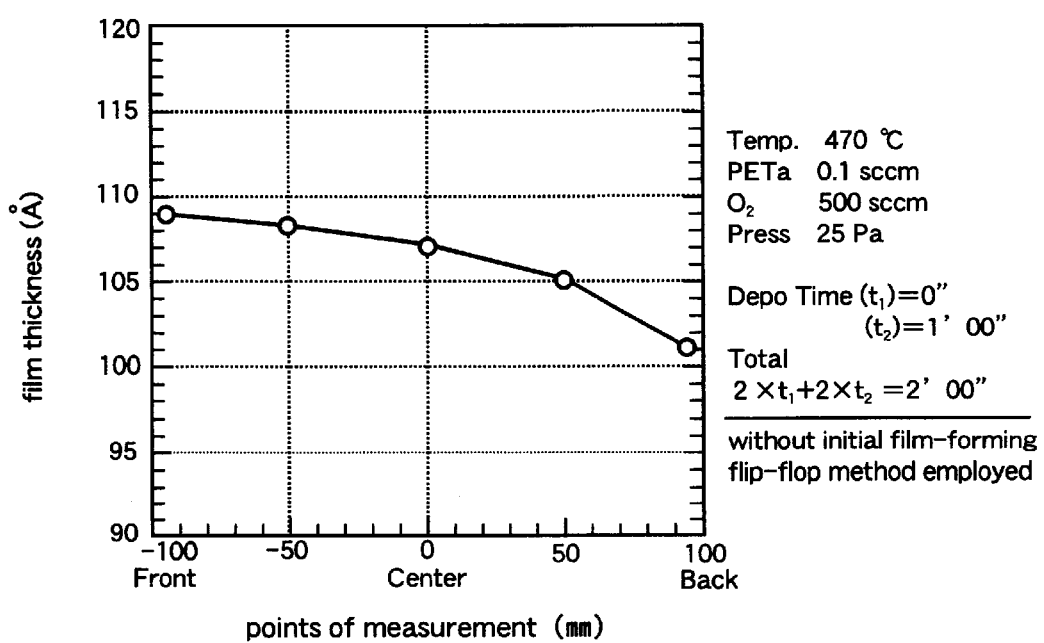
FIG. 6 is a view showing the distribution of the thickness of thin films formed on a substrate by means of a conventional flip-flop method without employing an initial film-forming step of the present invention in the case where the substrate comprises a silicon substrate.

FIG. 6 illustrates the distribution of the thickness of thin films formed on a substrate in the form of a silicon substrate by means of a conventional flip-flop method without adopting an initial film-forming method of the present invention. From this figure, it is clear that the film thickness increases from the upstream side (back side) to the downstream side (front side) in the direction of the gas stream D1.

The reason for this is considered that the surface condition of the silicon substrate had a great influence on the film forming and hence a uniform distribution of the film thickness was not obtained.

Figure 7:
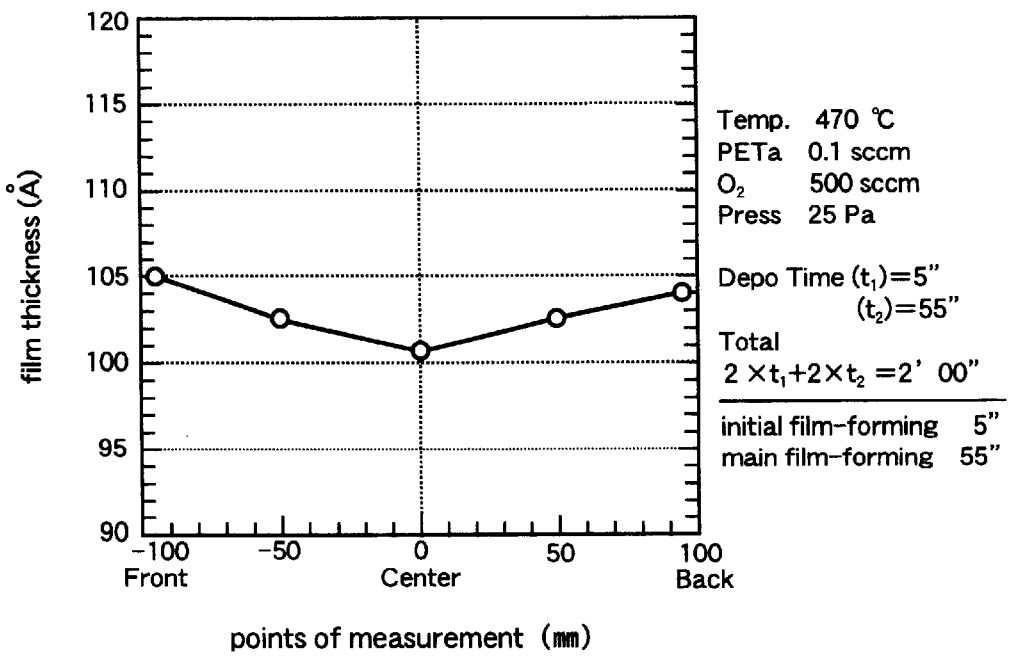
FIG. 7 is a view showing the distribution of the thickness of thin films formed on a substrate by means of a flip-flop method employing an initial film-forming step of the present invention in the case where the substrate comprises a silicon substrate.

FIG. 7 illustrates the distribution of the thickness of thin films formed on a substrate in the form of a silicon substrate by means of a flip-flop method adopting an initial film-forming method of the present invention. From this figure, it is evident that the film thickness is substantially uniform over the entire substrate surface from the upstream side to the downstream side and vice versa in either of the directions of the gas stream D1 and D2. The reason for this is considered that the influence of the surface condition of the silicon substrate was suppressed by the initial film-forming step, thereby providing a uniform distribution of film thickness.

Here, note that the time or duration for the film-forming process was set equally for the conventional method and the method of the present invention.

Figure 8:
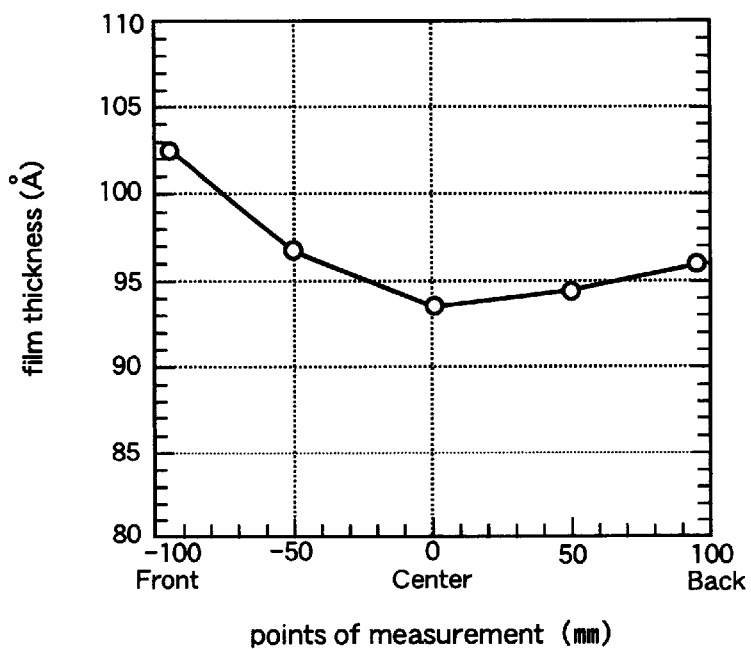
FIG. 8 is a view showing the distribution of the thickness of thin films formed on a substrate by means of a conventional flip-flop method without employing an initial film-forming step of the present invention in the case where the substrate comprises a silicon substrate with a nitride thin film having been formed on the substrate by means of fast nitriding.
Figure 9:
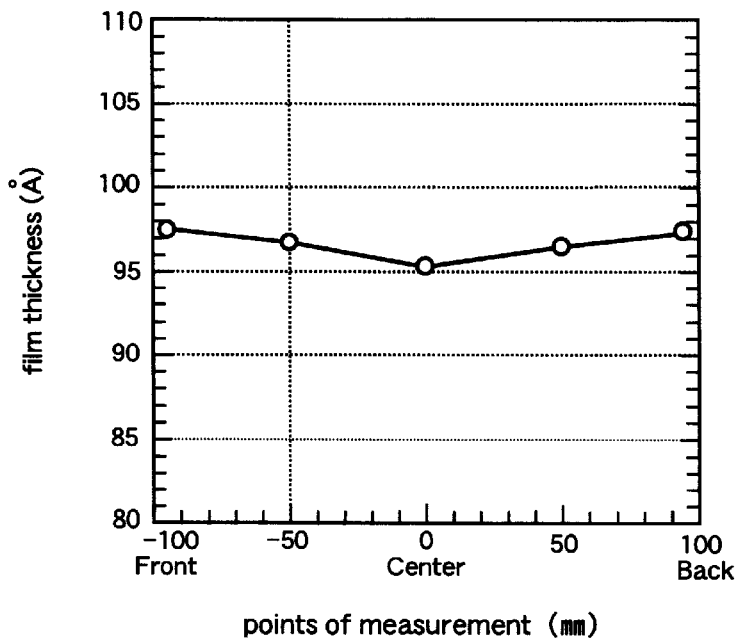
FIG. 9 is a view showing the distribution of the thickness of thin films formed on a substrate by means of a flip-flop method employing an initial film-forming step of the present invention in the case where the substrate comprises a silicon substrate with a nitride thin film having been formed on the substrate by means of fast nitriding.

FIG. 8 illustrates the distribution of the thickness of thin films formed on a substrate in the form of a silicon substrate, which has a nitride film created by fast nitriding, by means of a conventional flip-flop method without adopting an initial film-forming method of the present invention. From this figure, it is evident that the film thickness increases from the upstream side (back side) to the downstream side (front side) in the direction of the gas stream D1. The reason for this is considered that the surface condition of the substrate having the nitride film thereon had a great influence on the film forming and hence a uniform distribution of the film thickness was not obtained. Here, note that the time or duration for the film-forming process was set equally for the conventional method and the method of the present invention, FIG. 9 illustrates the distribution of the thickness of thin films formed on a substrate in the form of a silicon substrate, which has a nitride film created by fast nitriding, by means of a flip-flop method adopting an initial film-forming method of the present invention. From this figure, it is evident that the film thickness is substantially uniform over the entire substrate surface from the upstream side to the downstream side and vice versa in either of the directions of the gas stream D1 and D2. The reason for this is considered that the influence of the surface condition of the silicon substrate having the nitride film thereon was suppressed by the initial film-forming step, thereby providing a uniform distribution of film thickness.

Here, note that the time or duration for the film-forming process was set equally for the conventional method and the method of the present invention. Also the film-forming conditions were the same as those in FIG. 7.

Figure 10:
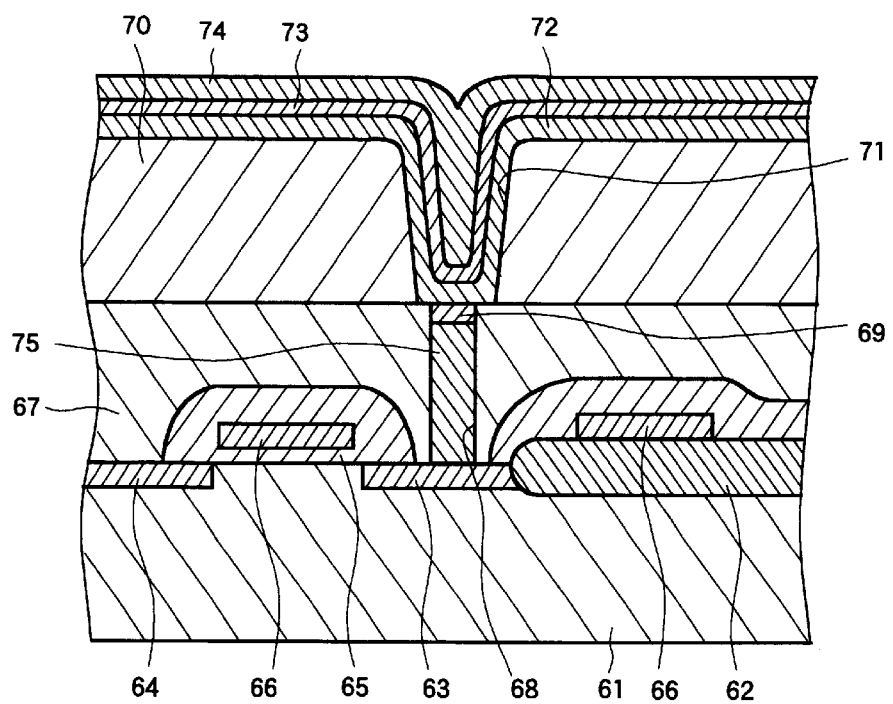
FIG. 10 is a cross sectional view showing a part of a DRAM which contains a thin film of $Ta_2O_5$ formed by using a semiconductor manufacturing method of the present invention.
Figure 11:
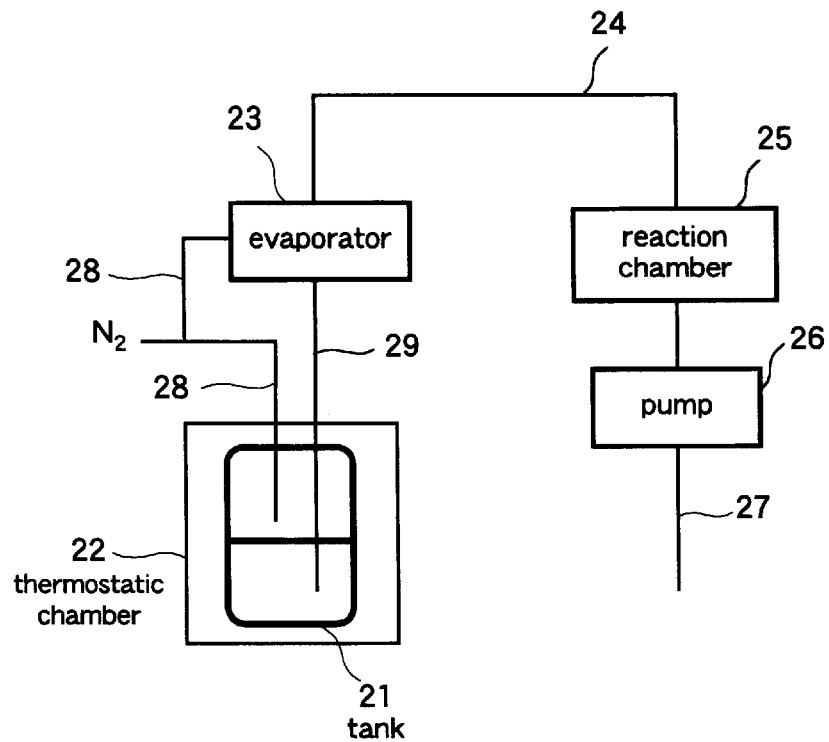
FIG. 11 is a schematic view illustrating one example of a conventional method for manufacturing a tantalum oxide thin film.

FIG. 10 is a cross sectional view showing a part of a DRAM which includes a $Ta_2O_5$ film formed by means of the manufacturing method of the present invention.

As shown in FIG. 10, on a surface of a silicon substrate 61, there is formed a field oxide film 62 which forms a lot of transistor-forming areas thereon in a mutually separated manner. That is, on the surface portion of the silicon substrate 61, there are formed a source electrode 63 and a drain electrode 64 with a gate electrode 66, acting as a word line, being provided therebetween through an intermediary of a gate insulating layer 65. On the gate insulating layer 65, there is provided a first interlayer insulating film 67 with a contact hole 68 formed therethrough. In the contact hole 68, there is disposed a barrier metal 69 and a plug electrode 75 connected to the source electrode 63. On the first interlayer insulating film 67, there is provided another or second interlayer insulating film 70 with a contact hole 71 formed therethrough. In the second interlayer insulating film 70 and the contact hole 71, there is provided a capacitance lower electrode 72 made of ruthenium and connected to the barrier metal 69. On the capacitance lower electrode 72 there is formed a capacitance insulating film 73 made of $Ta_2O_5$ on which are formed a capacitance upper electrode 74 made of ruthenium, titanium nitride or the like. That is, with this DRAM, a capacitor cell is connected with the source electrode 63 of a MOS transistor.

Next, a method for producing the DRAM shown in FIG. 10 will be described. First, the field oxide film 62 is formed in the surroundings of each transistor-forming area on the surface of the silicon substrate 61 by means of a LOCOS process. Subsequently, the gate electrode 66 is formed in each transistor-forming area through the gate insulating layer 65. Thereafter, impurities are introduced into the surface of the silicon substrate 61 by ion-implantation using the field oxide film 62 the gate electrode 66 as masks, thus forming the source electrode 63 and the drain electrode 64 in a self-aligned manner. After the gate electrode 66 is covered with an insulating film, the first interlayer insulating film 67 is formed. Then, the contact hole 68 is formed through the first interlayer insulating film 67 so as to expose the source electrode 63, and the plug electrode 75 and the barrier metal 69 are formed in the contact hole 68. Subsequently, the second interlayer insulating film 70 is formed on the first interlayer insulating film 67, and the contact hole 71 is formed through the interlayer insulating film 70 so as to expose the barrier metal 69. Thereafter, the ruthenium film is deposited on the second interlayer insulating film 70 and in the contact hole 71, and then subjected to patterning to form the capacitance lower electrode 72. Finally, the capacitance insulating film 73 made of $Ta_2O_5$ is formed on the capacitance lower electrode 72 by means of the manufacturing method of the present invention, and the capacitance upper electrode 74 made of ruthenium, titanium nitride or the like is formed on the capacitance insulating film 73.

As described in detail in the foregoing, according to the present invention, there is provided a semiconductor manufacturing method and a semiconductor manufacturing apparatus which can achieve the formation of thin films of a uniform thickness on a substrate.

While the invention has been described in terms of preferred embodiments, those skilled in the art will recognize that the invention can be practiced with modification within the spirit and scope of the appended claims.

What is claimed is:

1. A method for manufacturing a semiconductor device including a film-forming process for causing a film-forming gas to flow over a surface of a substrate substantially in parallel therewith to form thin films on said substrate surface, said film-forming process, comprising:

an initial film-forming step for forming a first thin film on the surface of said substrate under a first film-forming condition; and a main film-forming step for forming, on said first thin film, acting a backing layer, a second thin film of a thickness greater than that of said first thin film under a second film-forming condition that differs from said first film-forming condition wherein said film-forming gas used in said initial film-forming step is the same as that used in said main film-forming step.

2. The method for manufacturing a semiconductor device according to claim 1, wherein in said initial film-forming step, said film-forming gas is supplied a predetermined number of times by changing the direction of flow of said film-forming gas.

3. The method for manufacturing a semiconductor device according to claim 1, wherein a flow rate of said film-forming gas in said initial film-forming step is less than that in said main film-forming step.

4. The method for manufacturing a semiconductor device according to claim 1, wherein forming said first thin film and forming said second thin film constitute a thermal CVD method.

5. A method for manufacturing a semiconductor device including a film-forming process for causing a film-forming gas to flow over a surface of a substrate substantially in parallel therewith to form thin films on said substrate surface, said film-forming process comprising: an initial film-forming step for forming a first thin film on the surface of said substrate; and a main film-forming step for forming, on said first thin film acting as a backing layer, a second thin film at a film-forming rate greater than that in said initial film-forming step.

6. A method for manufacturing a semiconductor device including a film-forming process for forming thin films of tantalum oxide on a surface of a substrate by using a film-forming gas including a gas evaporated from pentaethoxy tantalum, said film-forming process comprising: an initial film-forming step for forming a first thin film of tantalum oxide on the surface of said substrate under a first film-forming condition; and a main film-forming step for forming, on said first thin film acting as a backing layer, a second thin film of tantalum oxide having a thickness greater than that of said first thin film under a second film-forming condition that differs from said first film-forming condition.

7. The method for manufacturing a semiconductor device according to claim 6, wherein in said film-forming process, said film-forming gas is caused to flow over the surface of said substrate substantially in parallel therewith.

8. The method for manufacturing a semiconductor device according to claim 6, wherein a flow rate of said film-forming gas in said initial film-forming step is less than that in said main film-forming step.

9. The method for manufacturing a semiconductor device according to claim 6, wherein the film-forming rate for said initial film-forming step is less than that for said main film forming step.

10. The method for manufacturing a semiconductor device according to claim 6, wherein said method further comprises a nitride film forming step on said surface of said substrate before said film-forming process and wherein, in said film-forming process, said thin films of tantalum oxide are formed on nitride films obtained.

11. The method for manufacturing a semiconductor device according to claim 6, wherein said thin films of tantalum oxide formed by said initial film-forming step have a thickness of 0.5–1.5 nm.

12. A method for manufacturing a semiconductor device including a film-forming process for forming thin films of tantalum oxide on a surface of a substrate by using a film-forming gas including a gas evaporated from pentaethoxy tantalum, said film-forming process comprising: an initial film-forming step for forming a first thin film of tantalum oxide on the surface of said substrate under a first film-forming condition; and a main film-forming step for forming, on said first thin film acting as a backing layer, a second thin film of tantalum oxide having a thickness greater than that of said first thin film under a second film-forming condition that differs from said first film-forming condition; wherein said initial film-forming step and said main film-forming step are performed continuously in a common reaction chamber by means of a thermal CVD method.

* * * * *